United States Patent

Kagawa et al.

[11] Patent Number: 6,045,371
[45] Date of Patent: Apr. 4, 2000

[54] CONNECTOR FOR ELECTRICAL CONNECTION OF CIRCUIT BOARDS AND SUCH A METHOD FOR ELECTRICAL CONNECTION OF CIRCUIT BOARDS USING SUCH A CONNECTOR

[75] Inventors: Kiyoshi Kagawa, Ohmihachiman; Toshiaki Tanaka, Kusatsu, both of Japan

[73] Assignee: International Business Machines Corporation, Armonk, N.Y.

[21] Appl. No.: 09/170,813

[22] Filed: Oct. 13, 1998

[30] Foreign Application Priority Data

Oct. 23, 1997 [JP] Japan .................................. 9-291382

[51] Int. Cl.[7] ........................................ H01R 9/09
[52] U.S. Cl. ........................................................ 439/74
[58] Field of Search ............................ 439/74, 83, 876, 439/540.1

[56] References Cited

U.S. PATENT DOCUMENTS 5,641,290   6/1997   Yagi ............................................ 439/74
5,885,092   3/1999   Ito et al. ..................................... 439/74
5,915,975   6/1999   McGrath ..................................... 439/74

*Primary Examiner*—Neil Abrams
*Assistant Examiner*—Brian S. Webb
*Attorney, Agent, or Firm*—Bernard D. Bogdon

[57] ABSTRACT

A circuit board connector for high density line connections for facilitating soldering of connector pins to electrodes on a circuit board. Provided is a connector wherein a first recessed portion and a second projecting portion of a first housing unit engage a first projecting portion and a second recessed portion of a second housing unit, so that the arms of connector pins that extend along the side walls of the recessed portions are electrically connected to the arms of connector pins extending along the corresponding projecting portions, and wherein a height H1 to the top surface of the first recessed portion is shorter than a height H2 to the top surface of the second projecting portion, and a height H3 to the top surface of the first projecting portion, engaging the first recessed portion, is greater than a height H4 to the top surface of the second recessed portion, engaging the second projecting portion. The height differentials provide for a connector structure which is open and readably accessible for soldering connections.

17 Claims, 4 Drawing Sheets

CONNECTOR FOR ELECTRICAL CONNECTION OF CIRCUIT BOARDS AND SUCH A METHOD FOR ELECTRICAL CONNECTION OF CIRCUIT BOARDS USING SUCH A CONNECTOR

FIELD OF THE INVENTION

This invention relates to a connector used for the electrical connection of boards and to a method for using such a connector to connect boards electrically. More specifically, the invention pertains to the structure of a connector used for the electrical connection of logical circuit boards on which logical circuit chips, etc., are mounted at a high component density, and to a method for using such a connector to connect the circuit boards electrically.

BACKGROUND OF THE INVENTION

As part of the process involved in the development of popular light, compact, portable, yet elaborate, electronic apparatuses, such as notebook versions of personal computers (PCS), the density of circuit boards employed for these devices has been increased.

A plurality of circuit boards mounted at a high component density are accumulated in a limited space, also, the depositing of signal lines at a higher component density, i.e., more electrodes at larger intervals, is required for connectors used for the electrical connection of circuit boards.

FIG. 1 is a diagram showing a conventional circuit board connector, and FIG. 2 is a cross-sectional view of the connector in FIG. 1 taken along the line A–A'.

In FIG. 1, connector 10 comprises a first housing unit 12 and a second housing unit 14. At a bottom portion 16 of the housing unit 12, a plurality of connector pins 22 are provided in an array with their ends ranged along two slots 18 and 20. The arms of the connector pins 22 extend outward parallel to the surface of the bottom portion 16 of the housing unit 12, and are bonded to a plurality of electrodes on a circuit board 26, such as by soldering. Similarly, as seen in FIG. 2, connector pins 28 are provided with their arms extending outward parallel to a bottom portion 24 of the second housing unit 14, and are bonded to a plurality of electrodes on a circuit board 30 by soldering.

Two projecting portions 32 formed inside the first housing unit 12 extend outward away from the bottom portion 16, with the connector pins 22 running downward along their enclosed side walls. And two opposing recessed portions 34, as best seen in FIG. 2, formed in the second housing unit 14 are located at the side opposite the bottom portion 24, with the connector pins 28 running upward along the interior of their side walls. Thus, when the two housing units 12 and 14 are coupled together in the direction indicated by the downward pointing arrows in FIG. 2, the projecting portions 32 engage the recessed portions 34, and the arms of the connector pins 22 contact arms of the connector pins 28 and establish an electrical connection.

Although the conventional circuit board connector, which has a higher signal line density, satisfies the need for increases in the number of electrodes and in the sizes of the intervals for circuit board connectors, it has the following deficiencies.

That is, since the interval "D" between the two slots in the bottom of the housing unit 12, as shown in FIG. 2, is narrow and the slots (recessed portions) defining the interval "D" is deep, in the soldering process (reflow process) for bonding the bottom of the housing unit 12 to the board, an infrared ray for heating that is provided upward from the surface of the board does not satisfactorily irradiate the connector pin terminals in the interval "D." As a result, the solder is not adequately heated (melted) and soldering failures can and do frequently occur.

Furthermore, when a soldering failure occurs at a connector pin terminal in the interval "D," it is difficult to insert the distal end of a soldering iron into the narrow and deep interval "D" between the two slots. As a result, considerable problems are encountered when attempting to correct a soldering failure. In some cases, correction is not possible.

SUMMARY OF THE INVENTION

To resolve the above problems, it is one object of the present invention to provide a novel board connector, one with which failures occur seldom, if ever. When the ends of connector pins are being soldered to electrodes on a circuit board, should solder failures occur, corrections can easily be made improving the efficiency and the yield of the circuit board manufacturing process. A further objective is to provide a method for the electrical connection of circuit boards using such a connector.

To achieve the above object, there is presented, a connector for the electrical connection of circuit boards including a first and a second housing unit, which first housing unit includes a first bottom portion and a second bottom portion, aligned parallel to the surface of a first board, from which arms of a plurality of first connector pins are exposed for electrical connection to a plurality of electrodes on the first board, a first recessed portion, along at least one side wall of which the other arms of the first connector pins are exposed at a side opposite the first bottom portion, and a second projecting portion, along at least one side wall of which the other arms of the first connector pins are exposed, at a side opposite the second bottom portion; and the second housing unit includes a third bottom portion and a fourth bottom portion, aligned parallel to the surface of a second board, from which arms of a plurality of second connector pins are exposed for electrical connection to a plurality of electrodes on the second board, a first projecting portion, along at least one side wall of which the other arms of the second connector pins are exposed, at a side opposite the third bottom portion, and a second recessed portion, along at least one side wall of which the other arms of the second connector pins are exposed, at a side opposite the fourth bottom portion; wherein the first recessed portion and the second projecting portion of the first housing unit engage the first projecting portion and the second recessed portion of the second housing unit, so that the arms of the first connector pins are electrically connected to the arms of the corresponding second connector pins, and wherein a height (H1) to the top surface of the first recessed portion is shorter than a height (H2) to the top surface of the second projecting portion, and a height (H3) to the top surface of the first projecting portion, engaging the first recessed portion, is greater than a height (H4) to the top surface of the second recessed portion, engaging the second projecting portion.

In addition, as further identified in the claims, unlike the arrangement in identified in the preceding paragraph wherein the first and the second housing units have individual recessed portions and projecting portions, provided is a connector for the electrical connection of boards wherein a first housing unit has two recessed portions and a second housing unit has two projecting portions; and wherein the two recessed portions of the first housing unit engage the two projecting portions of the second housing unit, so that the pin arms on the side walls of the recessed portions can be electrically connected to the pin arms on the side walls of the projecting portions.

Furthermore, according to the invention, provided are modules employing the above described connector, and a method for electrically connecting boards by using the connector.

DETAILED DESCRIPTION OF THE PREFERRED EMBODIMENT

Figure 1:
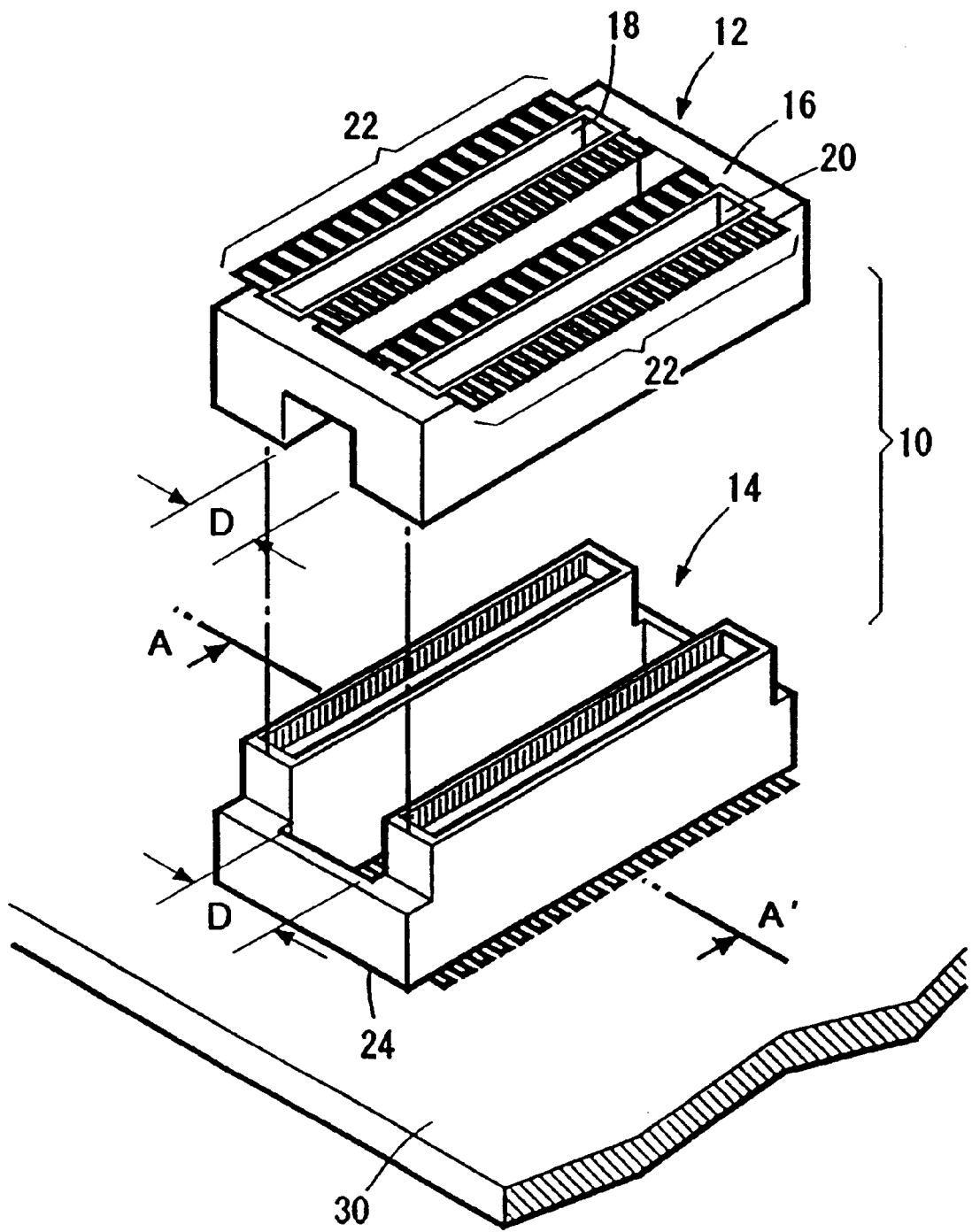
FIG. 1 is a diagram showing a conventional board connector in exploded and perspective view.
Figure 2:
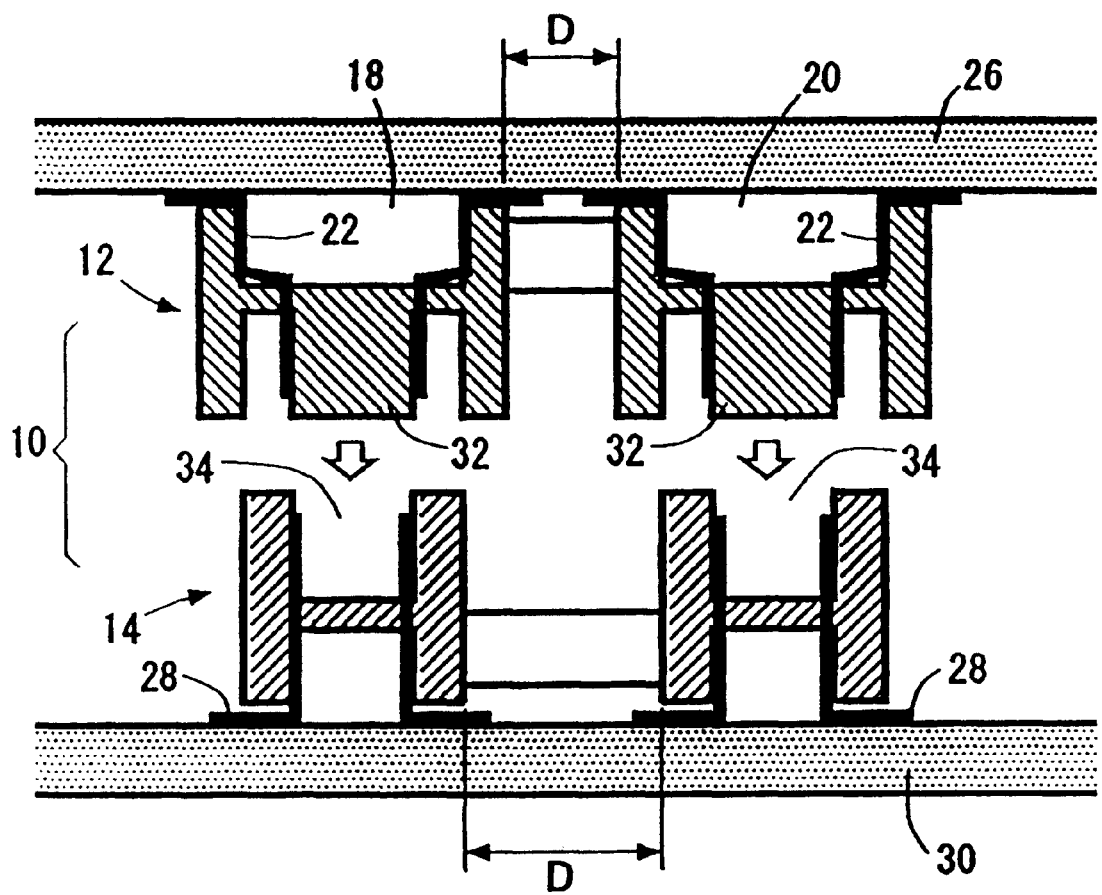
FIG. 2 is a cross-sectional view of the connector portions of FIG. 1 taken along the plane of line A–A' of FIG. 1.
Figure 3:
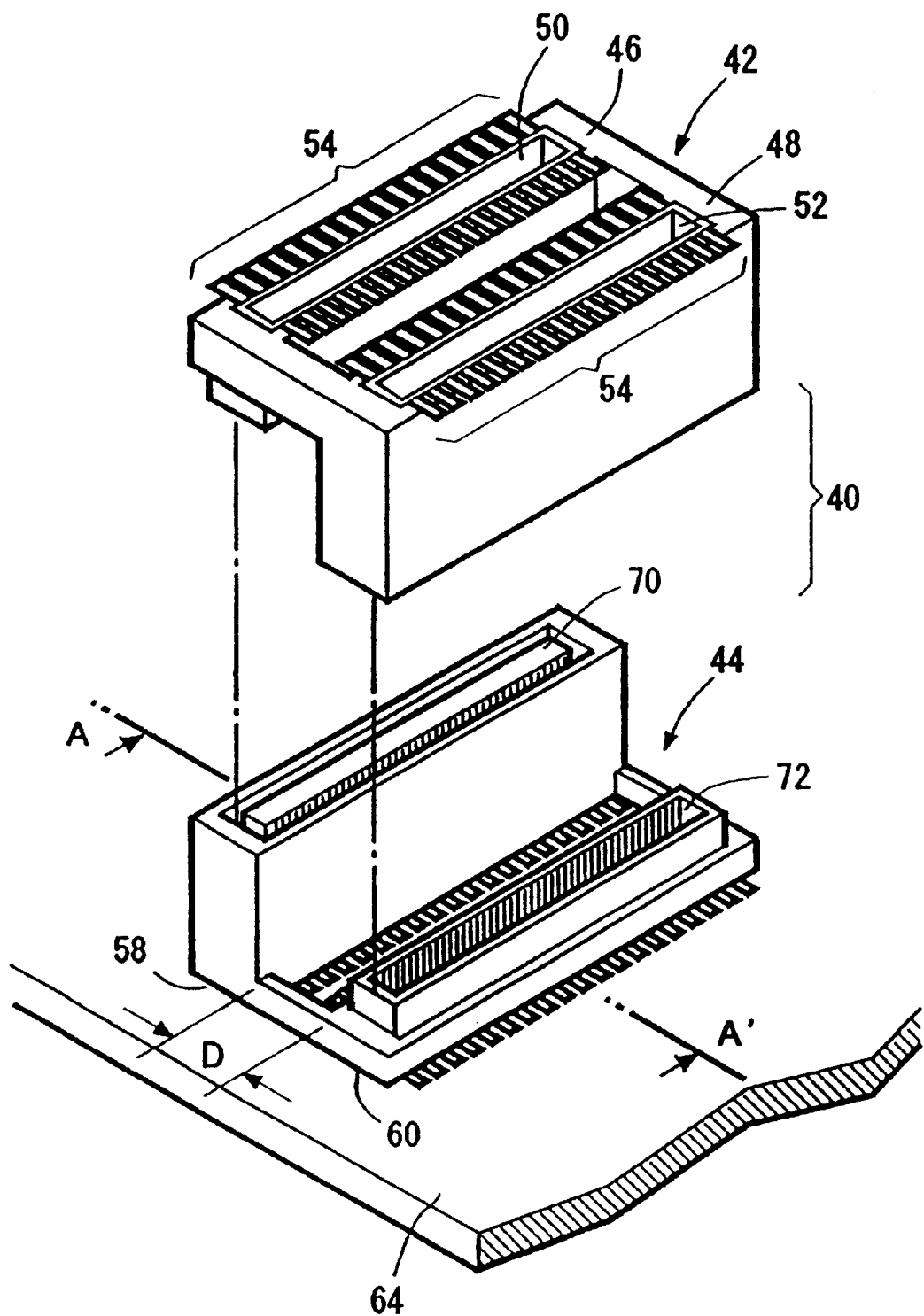
FIG. 3 is a diagram showing a board connector in exploded and perspective view according to the principles of the present invention.
Figure 4:
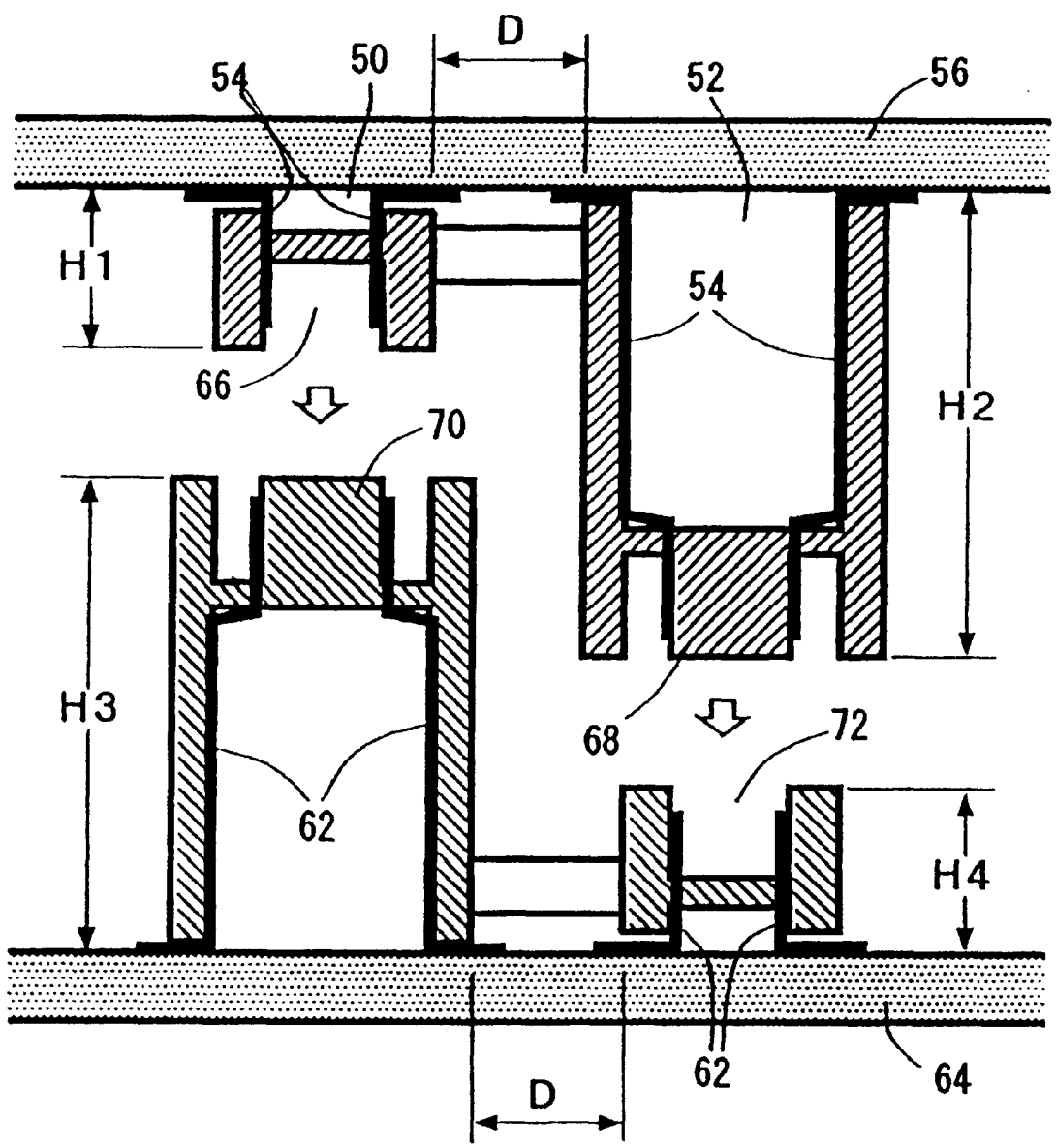
FIG. 4 is a cross-sectional view of the connector in FIG. 3 taken along the plane of line A–A' of FIG. 3.

FIG. 3 is a diagram illustrating a board connector 40 according to the principles of the present invention, and FIG. 4 is a cross-sectional view of the connector 40 in FIG. 3 taken along the line A–A' of FIG. 3.

The connector 40 includes a first housing unit 42 and a second housing unit 44. Slots 50 and 52 are formed in a first bottom portion 46 and a second bottom portion 48 of the first housing unit 42, and a plurality of connector pins 54 are provided in an array along the slots 50 and 52. The intervals between the connector pins are 1 mm or smaller, and several tens to several hundreds of pins are arranged at constant intervals within a distance of several cm.

The first bottom portion 46 and the second bottom portion 48 of the first housing unit 42, as seen in FIG. 3, are displayed parallel to the surface of a logical circuit board (hereinafter referred to as a "board") 56, as shown in FIG. 4. The arms of the connector pins 54 extend outward parallel to the surfaces of the bottom portions 46 and 48, and are bonded to a plurality of electrodes on the board 56 by soldering.

Similarly, the second housing unit 44 has a third bottom portion 58 and a fourth bottom portion 60, and the arms of the connector pins 62 are arranged along the bottom portions 58 and 60 and are bonded to a plurality of electrodes on a board 64 by a preferred soldering technique. The housing units are made of an insulating material, such as plastic, and the connector pins are made of fine lead lines.

A recessed portion 66 is formed in the side of the first housing unit 42 opposite the first bottom portion 46, and a projecting portion 68 is formed in the side of the first housing unit 42 opposite the second bottom portion 48. The connector pins 54 extend along the interior side walls of the recessed portion 66 and the enclosed side walls of the projecting portion 68. A projecting portion 70 is formed in the side of the second housing unit 44 opposite the third bottom portion 58, and a recessed portion 72 is formed in the side of the second housing unit 44 opposite the fourth bottom portion 60.

The connector pins 62 extend along the enclosed side walls of the projecting portion 70 and the interior side walls of the recessed portion 72. When the two housing units 42 and 44 are coupled together in the direction indicated by the arrows, the projecting portion 70 of the second housing unit 44 engages the recessed portion 66 of the first housing unit 42, while the projecting portion 68 of the first housing unit 42 engages the recessed portion 72 of the second housing unit 44. As a result, the arms of the connector pins 54 are connected to the arms of the connector pins 62, so that the electrical connection is established.

As is shown in FIGS. 3 and 4, the height "H1" to the top surface of the recessed portion 66 of the first housing unit 42 is shorter than the height "H2" to the top surface of the projecting portion 68. The height "H3" to the top surface of the projecting portion 70 of the second housing unit 44, engaging the recessed portion 66 of the first housing unit 42, is greater than the height "H4" to the top surface of the recessed portion 72, engaging the projecting portion 68 of the first housing unit 42. The height "H 1" to the top surface of the recessed portion 66 is equal to the height "H4" to the top surface of the recessed portion 72, while the height "H2" to the top surface of the projecting portion 68 is equal to the height "H3" up to the top surface of the projecting portion 70.

In other words, the difference in the heights to the top surfaces of the recessed portion 66 and the projecting portion 68 is equal to that of the projecting portion 70, engaging the recessed portion 66, and the recessed portion 72, engaging the projecting portion 68. As a result, the two boards 56 and 64 are aligned parallel to each other when the two housing units 42 and 44 are coupled together, and the electrical connection of the boards 56 and 64 via the connector pins 54 and 62 is ensured.

A method for establishing the electrical connection of boards using the connector 40 of the present invention is described and initially, the first and the second boards 56 and 64, and the connector 40 are prepared. Then, printing is used to apply paste solder to a plurality of electrodes on the first and the second boards 56 and 64. The first housing unit 42 and the second housing unit 44 of the connector 40 are positioned on the first and the second boards 56 and 64 of FIG. 4 to which the paste solder was applied. At this point, the electrodes on the boards 56 and 64 and the arms of the connector pins 54 and 62 are aligned. Following this, a reflow process is performed for the first board 56, on which the first housing unit 42 of the connector 40 is mounted, and the second board 64, on which the second housing unit 44 is mounted. During this reflow process, an infrared ray for heating solder is projected upward from the board, and the electrodes on the boards 56 and 64 are soldered to the arms of the connector pins 54 and 62. When the two housing units 42 and 44 of the connector 40 are coupled together, the electrical connection of the boards via the connector 40 is thereby established.

As is apparent from FIG. 3, in the connector of the present invention, the portion between the two slots (a middle portion) in the bottom portions of the housing unit is opened. Therefore, in the soldering procedure for the bottom portions of the housing unit and the boards, the connector pin terminals in the interval "D" are fully irradiated by the infrared ray, which is projected upward from the boards, and the solder is adequately heated. As a result, the connector pin ends can be satisfactorily soldered to the electrodes of the circuit boards. Thus, the previously mentioned conventional problem has been resolved. Even if a soldering failure occurs at a connector pin terminal in the interval "D," the distal end of a soldering iron can be easily inserted into the interval "D" to correct the soldering failure. Therefore, a further conventional problem can be resolved.

In addition, according to the connector of the present invention, since the first and the second housing units 42 and 44 have the same structure, a connector can be manufactured as a single unit, the number of parts required during the circuit board manufacturing process can be reduced, and an erroneous assembly of the first and the second housing units 42 and 44 will not occur. As a result, the efficiency and yield of the circuit board manufacturing process is improved.

For the connector in FIGS. 3 and 4, the first and the second housing units have individual recessed portions and projecting portions. However, the present invention is not limited to such a structure, and the first housing unit may have two recessed portions while the second housing unit may have two projecting portions. In such a case, the two recessed portions of the first housing unit engage the two projecting portions of the second housing unit to establish the electrical connection of the pin arms on the internal side walls of the recessed portions with the pin arms on the enclosed side walls of the corresponding projecting portions.

In addition, an integrated board module can be formed by connecting a plurality of boards using the connectors of the present invention, so that a logical circuit device having a higher component density can be provided.

It is claimed:

1. A connector for the electrical connection of circuit boards comprising:

a first and a second housing unit, the first housing unit, including:

a first bottom portion and a second bottom portion, aligned parallel to the surface of a first board, from which arms of a plurality of first connector pins are exposed for electrical connection to a plurality of electrodes on the first board, a first recessed portion, along at least one side wall of which the other arms of the first connector pins are exposed at a side opposite the first bottom portion, and a second projecting portion, along at least one side wall of which the other arms of said first connector pins are exposed, at a side opposite the second bottom portion; and the second housing unit, including:

a third bottom portion and a fourth bottom portion, aligned parallel to the surface of a second board, from which arms of a plurality of second connector pins are exposed for electrical connection to a plurality of electrodes on the second board, a first projecting portion, along at least one side wall of which the other arms of the second connector pins are exposed, at a side opposite the third bottom portion, and a second recessed portion, along at least one side wall of which the other arms of the second connector pins are exposed, at a side opposite the fourth bottom portion;

wherein the first recessed portion and the second projecting portion of the first housing unit engage the first projecting portion and the second recessed portion of the second housing unit, so that the arms of the first connector pins are electrically connected to the arms of the corresponding second connector pins, and wherein a height to the top surface of the first recessed portion is shorter than a height to the top surface of the second projecting portion, and a height to the top surface of the first projecting portion, which engages the first recessed portion, is greater than a height to the top surface of the second recessed portion, which engages the second projecting portion.

2. The connector as defined in claim 1, wherein a difference between the height up to the top surface of the first recessed portion and the height to the top surface of the second projecting portion equals a difference between the height up to the top surface of the first projecting portion, engaging the first recessed portion, and the height to the top surface of the second recessed portion, engaging the second projecting portion.

3. The connector as defined in claim 1, wherein, on the individual four bottom portions, arms of the connector pins are so arranged at predetermined intervals as to form two columns, separated by a constant interval, and wherein, along two facing side walls of each of the first recessed portion, the second projecting portion, the first projecting portion and the second recessed portion, the other arms of the connector pins are arranged at predetermined intervals.

4. The connector as defined in claim 1, wherein said connector pins are L-shaped connector pins.

5. The connector as defined in claim 4, wherein portions of the short arms of L-shaped connector pins are exposed, extending outward from the sides of the connector, while the longer arms of the L-shaped connector pins are enclosed within the connector.

6. The connector as defined in claim 1, wherein the two housing units are formed of an insulating material, and the connector pins are made of lead wire.

7. The connector as defined in claim 1, wherein the boards include logical circuit boards.

8. A connector for the electrical connection of circuit boards comprising:

a first and a second housing unit, the first housing unit, including:

a first bottom portion and a second bottom portion, aligned parallel to the surface of a first board, from which arms of a plurality of first connector pins are exposed for electrical connection to a plurality of electrodes on the first board, a first recessed portion, along at least one side wall of which the other arms of the first connector pins are exposed at a side opposite the first bottom portion, and a second recessed portion, along at least one side wall of which the other arms of the first connector pins are exposed, at a side opposite the second bottom portion; and the second housing unit, including:

a third bottom portion and a fourth bottom portion, aligned parallel to the surface of a second board, from which arms of a plurality of second connector pins are exposed for electrical connection to a plurality of electrodes on the second board, a first projecting portion, along at least one side wall of which the other arms of the second connector pins are exposed, at a side opposite the third bottom portion, and a second projecting portion, along at least one side wall of which the other arms of the second connector pins are exposed, at a side opposite the fourth bottom portion;

wherein the first and said second recessed portions of the first housing unit engage the first and the second projecting portions of the second housing unit, so that the arms of the first connector pins are electrically connected to the arms of the corresponding second connector pins, and wherein a height to the top surface of the first recessed portion is shorter than a height to the top surface of the second recessed portion, and a height to the top surface of the first projecting portion, which engages the first recessed portion, is greater than a height to the top surface of the second projecting portion, which engages the second recessed portion.

9. The connector as defined in claim 8, wherein a difference between the height up to the top surface of the first recessed portion and the height to the top surface of the second recessed portion equals a difference between the height up to the top surface of the first projecting portion, engaging the first recessed portion, and the height to the top surface of the second projecting portion, engaging the second recessed portion.

10. The connector as defined in claim 8, wherein, on the individual four bottom portions, arms of the connector pins are so arranged at predetermined intervals as to form two columns, separated by a constant interval, and wherein, along two facing side walls of each of the first recessed portion, the second recessed portion, the first projecting portion and the second projecting portion, the other arms of the connector pins are arranged at predetermined intervals.

11. The connector as defined in claim 8, wherein the connector pins are L-shaped connector pins.

12. The connector as defined in claim 11, wherein portions of the short arms of L-shaped connector pins are exposed, extending outward from the sides of the connector, while the longer arms of the L-shaped connector pins are enclosed within the connector.

13. The connector as defined in claim 8, wherein the two housing units are formed of an insulating material, and the connector pins are made of lead wire.

14. The connector as defined in claim 8, wherein the boards include logical circuit boards.

15. A board module comprising:

a first board;

a second board;

a connector for the electrical connection of the first and the second boards, the connector including a first and a second housing unit, the first housing unit including:

a first bottom portion and a second bottom portion, aligned parallel to the surface of a first board, from which arms of a plurality of first connector pins are exposed for electrical connection to a plurality of electrodes on the first board, a first recessed portion, along at least one side wall of which the other arms of the first connector pins are exposed at a side opposite the first bottom portion, and a second projecting portion, along at least one side wall of which the other arms of the first connector pins are exposed, at a side opposite the second bottom portion; and the second housing unit including:

a third bottom portion and a fourth bottom portion, aligned parallel to the surface of a second board, from which arms of a plurality of second connector pins are exposed for electrical connection to a plurality of electrodes on the second board, a first projecting portion, along at least one side wall of which the other arms of the second connector pins are exposed, at a side opposite the third bottom portion, and a second recessed portion, along at least one side wall of which the other arms of the second connector pins are exposed, at a side opposite the fourth bottom portion;

wherein the first recessed portion and the second projecting portion of the first housing unit engage the first projecting portion and the second recessed portion of the second housing unit, so that the arms of the first connector pins are electrically connected to the arms of the corresponding second connector pins, and wherein a height to the top surface of the first recessed portion is shorter than a height to the top surface of the second projecting portion, and a height to the top surface of the first projecting portion, engaging the first recessed portion, is greater than a height to the top surface of the second recessed portion, engaging the second projecting portion.

16. A board module comprising:

a first board;

a second board;

a connector for the electrical connection of the first and the second boards, the connector including a first and a second housing unit, the first housing unit including:

a first bottom portion and a second bottom portion, aligned parallel to the surface of a first board, from which arms of a plurality of first connector pins are exposed for electrical connection to a plurality of electrodes on the first board, a first recessed portion, along at least one side wall of which the other arms of the first connector pins are exposed at a side opposite the first bottom portion, and a second recessed portion, along at least one side wall of which the other arms of the first connector pins are exposed, at a side opposite the second bottom portion; and the second housing unit including:

a third bottom portion and a fourth bottom portion, aligned parallel to the surface of a second board, from which arms of a plurality of second connector pins are exposed for electrical connection to a plurality of electrodes on the second board, a first projecting portion, along at least one side wall of which the other arms of the second connector pins are exposed, at a side opposite the third bottom portion, and a second projecting portion, along at least one side wall of which the other arms of the second connector pins are exposed, at a side opposite the fourth bottom portion;

wherein the first and the second recessed portions of the first housing unit engage the first and the second projecting portions of the second housing unit, so that the arms of the first connector pins are electrically connected to the arms of the corresponding second connector pins, and wherein a height to the top surface of the first recessed portion is shorter than a height to the top surface of the second recessed portion, and a height to the top surface of the first projecting portion, engaging the first recessed portion, is greater than a height to the top surface of the second projecting portion, engaging the second recessed portion.

17. A method for the electrical connection of boards comprising the steps of:

preparing first and second boards; preparing a connector including first and second housing units for electrically connecting the first and the second boards;

applying paste solder to a plurality of electrodes on the first and the second boards;

arranging the first and the second housing units on the first and the second boards onto which the paste solder has been applied; and performing a reflow process for the first board, on which is mounted the first housing unit of the connector, and the second board, on which is mounted the second housing unit, said first housing unit including, a first bottom portion and a second bottom portion, aligned parallel to the surface of a first board, from which arms of a plurality of first connector pins are exposed for electrical connection to a plurality of electrodes on the first board, a first recessed portion, along at least one side wall of which the other arms of the first connector pins are exposed at a side opposite the first bottom portion, and a second projecting portion, along at least one side wall of which the other arms of the first connector pins are exposed, at a side opposite the second bottom portion; and the second housing unit including, a third bottom portion and a fourth bottom portion, aligned parallel to the surface of a second board, from which arms of a plurality of second connector pins are exposed for electrical connection to a plurality of electrodes on the second board, a first projecting portion, along at least one side wall of which the other arms of the second connector pins are exposed, at a side opposite the third bottom portion, and a second recessed portion, along at least one side wall of which the other arms of the second connector pins are exposed, at a side opposite the fourth bottom portion, wherein the first recessed portion and the second projecting portion of the first housing unit engage the first projecting portion and the second recessed portion of the second housing unit, so that the arms of the first connector pins are electrically connected to the arms of the corresponding second connector pins, and wherein a height to the top surface of the first recessed portion is shorter than a height to the top surface of the second projecting portion, and a height to the top surface of the first projecting portion, engaging the first recessed portion, is greater than a height to the top surface of the second recessed portion, engaging the second projecting portion.

* * * * *